(12) United States Patent
Hao et al.

(10) Patent No.: US 6,415,736 B1
(45) Date of Patent: Jul. 9, 2002

(54) GAS DISTRIBUTION APPARATUS FOR SEMICONDUCTOR PROCESSING

(75) Inventors: Fangli Hao, Cupertino; Rajinder Dhindsa, San Jose, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/343,481

(22) Filed: Jun. 30, 1999

(51) Int. Cl.[7] .............................. C23C 16/00; H05H 1/00
(52) U.S. Cl. .......................... 118/723 E; 118/723 ER; 156/345.34; 156/345.43; 156/345.47
(58) Field of Search .................. 118/715, 723 VE, 118/723 R, 723 E; 156/345

(56) References Cited

U.S. PATENT DOCUMENTS

| | | | |
|---|---|---|---|
| 4,209,357 A | 6/1980 | Gorin et al. ................ 156/643 |
| 4,263,088 A | 4/1981 | Gorin ......................... 156/626 |
| 4,270,999 A | 6/1981 | Hassan et al. .......... 204/192 E |
| 4,297,162 A | 10/1981 | Mundt et al. ............... 156/643 |
| 4,534,816 A | 8/1985 | Chen et al. ................. 156/345 |
| 4,579,618 A | 4/1986 | Celestino et al. .......... 156/345 |
| 4,590,042 A | 5/1986 | Drage ................... 422/186.06 |
| 4,612,077 A | 9/1986 | Tracy et al. ................ 156/345 |
| 4,612,432 A | 9/1986 | Sharp-Geisler |
| 4,780,169 A | 10/1988 | Stark et al. ................. 156/345 |
| 4,792,378 A | 12/1988 | Rose et al. ................. 156/643 |
| 4,820,371 A | 4/1989 | Rose ........................... 156/345 |
| 4,854,263 A * | 8/1989 | Chang et al. ............... 118/715 |
| 5,006,220 A | 4/1991 | Hijikata et al. ........ 204/298.33 |
| 5,074,456 A | 12/1991 | Degner et al. .............. 228/121 |
| 5,134,965 A | 8/1992 | Tokuda et al. .............. 118/723 |
| 5,472,565 A | 12/1995 | Mundt et al. ................. 216/71 |
| 5,494,713 A | 2/1996 | Ootuki ........................ 427/579 |
| 5,503,881 A | 4/1996 | Cain et al. |
| 5,529,657 A | 6/1996 | Ishii ............................ 156/345 |
| 5,534,751 A | 7/1996 | Lenz et al. .............. 315/111.71 |
| 5,569,356 A | 10/1996 | Lenz et al. .............. 156/643.1 |
| 5,593,540 A | 1/1997 | Tomita et al. ........... 156/643.1 |
| 5,595,602 A * | 1/1997 | Harlan ........................ 118/715 |
| 5,595,627 A | 1/1997 | Inazawa et al. .......... 156/643.1 |
| 5,614,055 A | 3/1997 | Fairbairn et al. ........... 156/345 |
| 5,716,485 A | 2/1998 | Salimian et al. ............ 156/345 |
| 5,736,457 A | 4/1998 | Zhao ........................... 438/624 |
| 5,746,875 A | 5/1998 | Maydan et al. ............. 156/345 |
| 5,820,723 A | 10/1998 | Benjamin et al. ........... 156/345 |
| 5,888,907 A | 3/1999 | Tomoyasu et al. ......... 438/714 |
| 6,106,663 A * | 8/2000 | Kuthi et al. ................. 156/345 |

FOREIGN PATENT DOCUMENTS

| | | | |
|---|---|---|---|
| EP | 0452745 A | | 10/1991 |
| JP | 02188916 | | 7/1990 |
| JP | 6-151336 | * | 5/1994 |
| JP | 10064831 | | 3/1998 |
| JP | 11204444 | | 7/1999 |

OTHER PUBLICATIONS

Notification of Transmittal of International Preliminary Examination Report dated Sep. 6, 2001 for PCT/US00/16143, International Filind Date Jun. 12, 2000, Priority Date Jun. 30, 1999.

* cited by examiner

*Primary Examiner*—Gregory Mills
*Assistant Examiner*—P. Hassanzadeh
(74) *Attorney, Agent, or Firm*—Burns, Doane, Swecker & Mathis, LLP

(57) ABSTRACT

A gas distribution system for semiconductor processing includes a contoured surface to achieve a desired gas distribution on the backside of a showerhead. The system can include one or more gas supplies opening into a plenum between a baffle plate and a temperature-controlled support member. The baffle plate can have a nonuniform thickness and geometry-controlled openings to achieve a desired gas distribution. In one arrangement the baffle plate is conical in shape with uniform diameter holes extending different distances through the baffle plate to achieve a uniform pressure of gas through outlets in a planar bottom surface of the baffle plate. In another arrangement, the holes have progressively larger diameters in a direction away from the location of the centrally located gas supply outlet. The shape of the baffle plate and/or configuration of the holes can be designed to achieve a desired gas pressure distribution.

17 Claims, 5 Drawing Sheets

GAS DISTRIBUTION APPARATUS FOR SEMICONDUCTOR PROCESSING

FIELD OF THE INVENTION

The present invention relates to reaction chambers used for processing semiconductor substrates, such as integrated circuit wafers, and specifically to improvements in the gas distribution system used in these reaction chambers.

BACKGROUND OF THE INVENTION

Semiconductor processing includes deposition processes such as chemical vapor deposition (CVD) of metal, dielectric and semiconducting materials, etching of such layers, ashing of photoresist masking layers, etc. In the case of etching, plasma etching is conventionally used to etch metal, dielectric and semiconducting materials. A parallel plate plasma reactor typically includes a gas chamber including one or more baffles, a showerhead electrode through which etching gas passes, a pedestal supporting the silicon wafer on a bottom electrode, an RF power source, and a gas injection source for supplying gas to the gas chamber. Gas is ionized by the electrode to form plasma. The plasma etches the wafer supported below the showerhead electrode.

Showerhead electrodes for plasma processing of semiconductor substrates are disclosed in commonly assigned U.S. Pat. Nos. 5,074,456; 5,472,565; 5,534,751; and 5,569,356. Other showerhead electrode gas distribution systems are disclosed in U.S. Pat. Nos. 4,209,357; 4,263,088; 4,270,999; 4,297,162; 4,534,816; 4,579,618; 4,590,042; 4,593,540; 4,612,077; 4,780,169; 4,792,378; 4,820,371; 4,854,263; 5,006,220; 5,134,965; 5,494,713; 5,529,657; 5,593,540; 5,595,627; 5,614,055; 5,716,485; 5,746,875 and 5,888,907.

During the plasma etching process, plasma is formed above the masked surface of the wafer by adding large amounts of energy to a gas at relatively low pressure, ionizing the gas to form plasma. By adjusting the electrical potential of the wafer, charged species in the plasma can be directed to impinge perpendicularly upon the wafer, so that materials in unmasked regions of the wafer are removed.

It is desirable to evenly distribute the plasma over the surface of the wafer in order to obtain uniform etching rates over the entire surface of the wafer. Current gas distribution chamber designs include multiple baffles which are optimized to uniformly distribute etching gas to achieve the desired etching effect at the wafer. Conventional gas distribution designs include baffles having hundreds of openings or complex, difficult to manufacture geometries to ensure even distribution of etching gas to the backside of the showerhead electrode. Some attempts have been made to control gas flow by using a shaped electrode. However, manufacturing very pure silicon electrodes having complicated geometries is difficult and expensive. When etching large, twelve-inch (300 mm) wafers, controlling the process gas to create a uniform pressure distribution across the showerhead is even more difficult. The number of openings and baffles must be increased significantly to maintain uniform distribution of the etching gas. As the number of openings in the baffles increase and the number of baffles increase, the complexity and cost to manufacture such a gas distribution apparatus increase greatly.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

From the foregoing it can be seen that as the size of semiconductor substrates increases, the ability to achieve uniform distribution of process gas above the substrates becomes more difficult. Accordingly, there is a need in the art for improvements in gas distribution systems. Further, to the extent that components of gas distribution systems are regularly replaced, it would be desirable if such components could be designed in a manner which facilitates economical manufacture thereof.

SUMMARY OF THE INVENTION

The present invention provides a gas distribution system which includes a contoured surface in a gas distribution chamber to achieve desired gas distribution delivered through a showerhead. Thus, the geometry of the contoured surface can be selected to optimize gas flow between the showerhead and the semiconductor substrate being processed.

The gas distribution system in accordance with the invention preferably includes a support body, a gas distribution chamber, a gas supply inlet, a showerhead and the contoured surface. The gas supply inlet supplies pressurized process gas into the gas distribution chamber and the showerhead is supported by the support body such that pressurized process gas in the gas distribution chamber applies pressure to a backside of the showerhead and passes through openings extending between the backside and an opposite side of the showerhead. The contoured surface is in the gas distribution chamber and is effective to provide a desired gas pressure distribution at the backside of the showerhead.

The contoured surface can be located on the support body or on a baffle plate located in the gas distribution chamber. For instance, the contoured surface can comprise a nonplanar upper and/or lower surface of the baffle plate or on a lower surface of the support body. The gas distribution chamber can comprise upper and/or lower plenums on opposite sides of the baffle plate or an open space between the contoured surface and the backside of the showerhead. The support body can include at least one coolant channel in which coolant can be circulated.

The gas inlet can open into various portions of the gas distribution chamber. For instance, the gas inlet can supply the process gas through a central opening in a planar surface of the support body facing the baffle plate in which case the baffle plate has a thickness which is larger in a central portion of the baffle plate and smaller at an outer portion of the baffle plate. Alternatively, the gas inlet can supply the process gas through an annular channel which opens into an outer region of the upper plenum in which case the baffle plate has a thickness which is smaller in a central portion thereof and larger at an outer portion thereof. The baffle plate can include uniformly sized openings extending between the upper and lower surfaces thereof, the openings having longer lengths either in the central portion of the baffle plate or in the outer portion of the baffle plate.

In the case where the contoured surface is a lower surface of the support body, the gas inlet can supply the process gas through a central opening in the lower surface and the open space can be smaller in a central region thereof and larger in an outer region thereof. Alternatively, the gas inlet can supply the process gas through an inlet which opens into an outer region of the open space in which case the showerhead can be spaced further from the contoured surface in the center region and closer to the contoured surface in the outer region.

The contoured surface can be an upper and/or lower nonplanar surface of a baffle section which is integral with the support body in which case the gas distribution chamber comprises an upper plenum above the baffle section and a lower plenum below the baffle section. In such a case, the upper plenum can be enclosed by an upper sidewall of the support body and a cover plate (which optionally can include one or more coolant channels) which seals against the upper sidewall and the lower plenum can be enclosed by a lower sidewall of the support body and the showerhead which seals against the lower sidewall.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENTS

Figure 1:
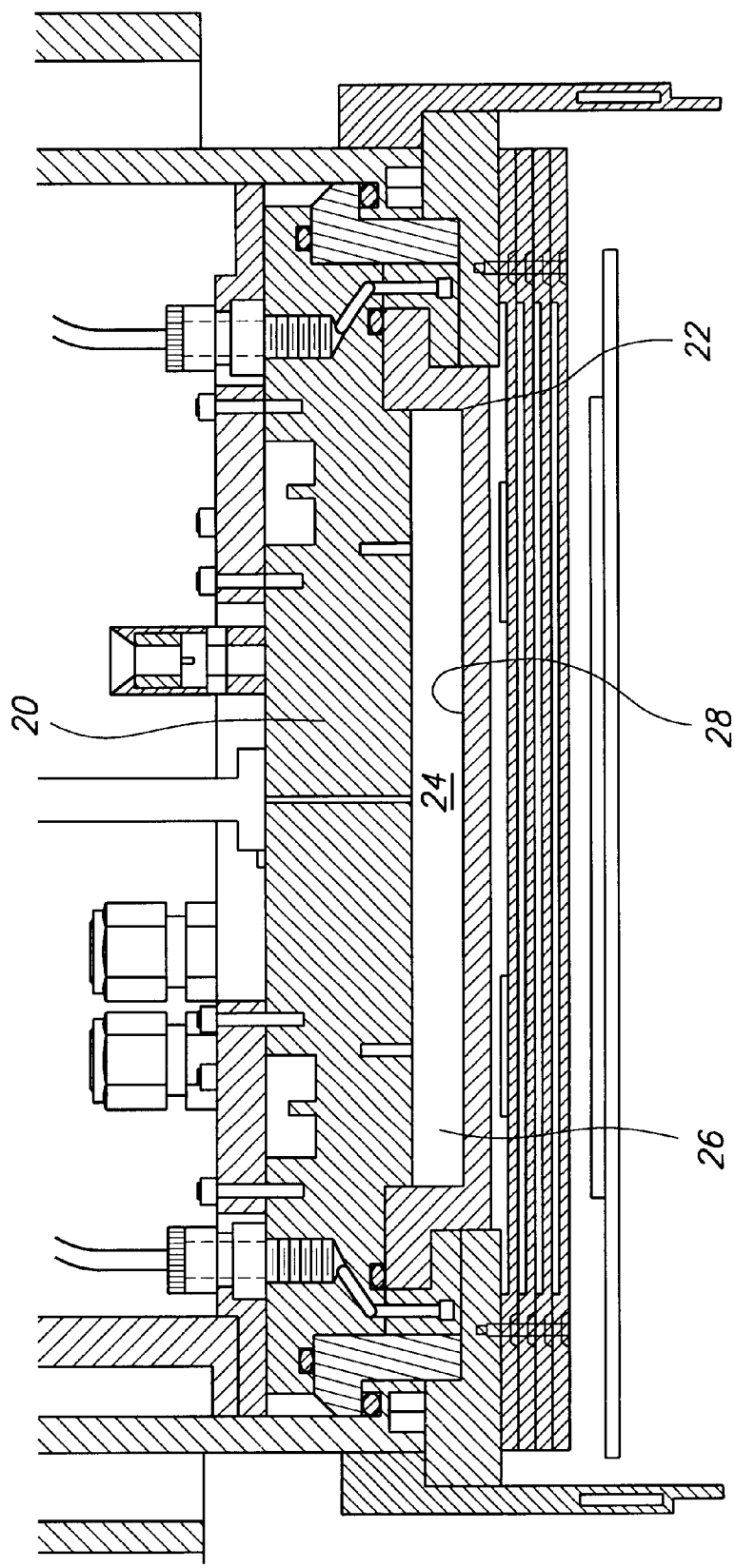
FIG. 1 is a sectional view of a gas distribution chamber according to the present invention.

For a better understanding of the invention, the following detailed description refers to the accompanying drawings, wherein preferred exemplary embodiments of the present invention are illustrated and described. In addition, the reference numbers used to identify key elements of the invention in the drawings are consistent throughout.

According to the present invention, process gas can be uniformly distributed from one or more gas supplies to a substrate positioned underneath a showerhead. The showerhead can be used in any type of semiconductor processing apparatus wherein it is desired to distribute process gas over a semiconductor substrate. Such apparatus includes CVD systems, ashers, capacitive coupled plasma reactors, inductive coupled plasma reactors, ECR reactors, and the like.

A gas distribution system for a parallel plate plasma reactor is shown in FIG. 1 wherein a support plate 20 and a showerhead 22 are secured together to define a sealed gas distribution chamber 24. A baffle assembly 26, including one or more baffle plates, is located between the support plate 20 and the showerhead 22. According to the present invention, the geometry and arrangement of the baffle assembly 26 is configured to uniformly distribute gas to a backside 28 of the showerhead 22. In semiconductor wafer processes such as chemical vapor deposition or dry-etch plasma processes, the controlled distribution of process gas across the substrate is desirable in order to increase the consistency and yield of these processes.

According to the invention, a contoured surface is used to provide a desired gas pressure distribution on the backside of a showerhead. The gas distribution system preferably includes a support body, a gas distribution chamber, a gas supply inlet, a showerhead and the contoured surface. The gas supply inlet supplies pressurized process gas into the gas distribution chamber and the showerhead is supported by the support body such that pressurized process gas in the gas distribution chamber applies pressure to a backside of the showerhead and passes through openings extending between the backside and an opposite side of the showerhead.

The contoured surface can be located on the support body or on a baffle plate located in the gas distribution chamber. For instance, the contoured surface can comprise a nonplanar upper and/or lower surface of the baffle plate or on a lower surface of the support body. The gas distribution chamber can comprise upper and/or lower plenums on opposite sides of the baffle plate or an open space between the contoured surface and the backside of the showerhead. The support body can include at least one coolant channel in which coolant can be circulated.

The gas inlet can open into various portions of the gas distribution chamber. For instance, the gas inlet can supply the process gas through a central opening in a planar surface of the support body facing the baffle plate in which case the baffle plate has a thickness which is larger in a central portion of the baffle plate and smaller at an outer portion of the baffle plate. Alternatively, the gas inlet can supply the process gas through an inlet which opens into an outer region of the upper plenum in which case the baffle plate has a thickness which is smaller in a central portion thereof and larger at an outer portion thereof. The baffle plate can include uniformly sized openings extending between the upper and lower surfaces thereof, the openings having longer lengths either in the central portion of the baffle plate or in the outer portion of the baffle plate.

In the case where the contoured surface is a lower surface of the support body, the gas inlet can supply the process gas through a central opening in the lower surface and the open space can be smaller in a central region thereof and larger in an outer region thereof. Alternatively, the gas inlet can supply the process gas through an inlet such as an annular channel which opens into an outer region of the open space in which case the showerhead can be spaced closer to the contoured surface in the outer region and further from the contoured surface in the central region. Also, an inlet could be provided on only one side of the open space in which case the contoured surface would be shaped to achieve the desired gas pressure distribution.

The contoured surface can be an upper and/or lower nonplanar surface of a baffle section which is integral with the support body in which case the gas distribution chamber comprises an upper plenum above the baffle section and a lower plenum below the baffle section. In such a case, the upper plenum can be enclosed by an upper sidewall of the support body and a cover plate (which optionally can include one or more coolant channels) which seals against the upper sidewall and the lower plenum can be enclosed by a lower sidewall of the support body and the showerhead which seals against the lower sidewall.

Figure 2:
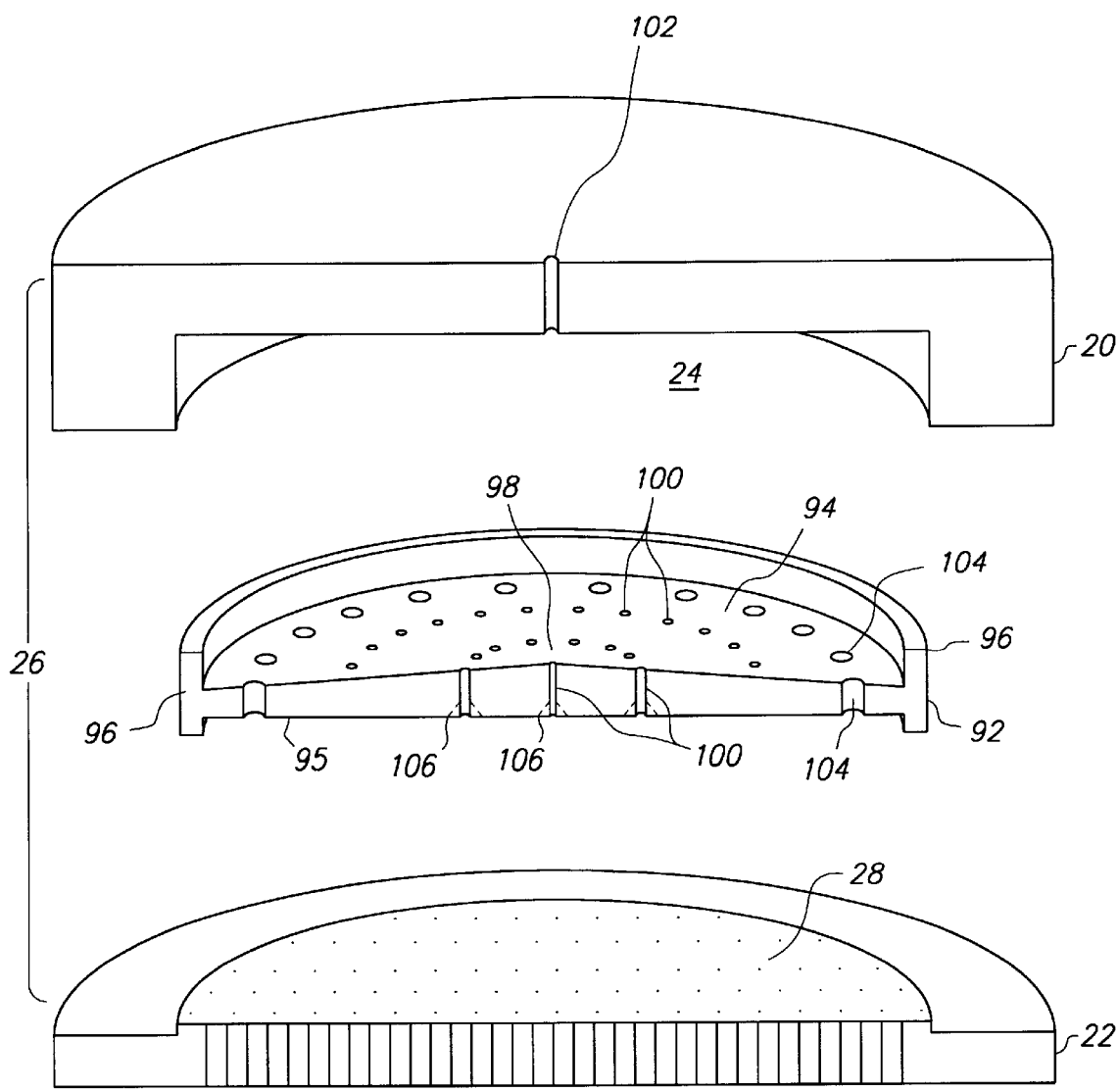
FIG. 2 is an exploded perspective sectional view of a third embodiment of a gas distribution system according to the invention.

The contoured surface can be provided on a baffle plate of non-uniform thickness and the baffle plate can include geometry controlled openings wherein lengths and/or sizes of the openings are varied to achieve the desired gas distribution. One embodiment of the contoured baffle plate is shown in FIG. 2 wherein a baffle plate 92 includes a contoured top surface 94. The baffle plate 92 is secured within a gas distribution chamber 24 defined by the support plate 20 and the showerhead 22. The baffle plate 92 includes a peripheral wall 96 that contacts the showerhead 22 and support plate 20. Alternatively, the baffle plate 92 may be formed integral with support plate 20 by providing a recess in the upper surface of the support plate and sealing the recess with a cover plate. In the case where gas pressure is highest above the center of the baffle plate, uniform gas pressure below the baffle plate can be achieved by designing the contoured top surface 94 to slope continuously from a central high portion 98 towards the periphery of the gas distribution chamber 24. Gas passes through openings 100 which are perpendicular to a planar bottom surface 95 of the baffle plate 92. If desired, however, some or all of the openings 100 can be non-perpendicular to the bottom surface.

In the arrangement shown in FIG. 2, process gas is delivered through a generally centrally located gas supply 102. However, gas may be supplied through a non-centrally located gas supply and/or multiple gas supplies. In the plenum between support plate 20 and the upper surface 94 of the baffle plate 92, process gas pressure is greatest nearest the centrally located gas supply inlet 102 and decreases towards the periphery of the baffle plate 92. Pressure losses due to friction occur as the gas passes through the openings 100 in the baffle plate 92. For openings having a circular cross-section, such a pressure drop can be represented by the formula $C D^3/L$ wherein C is the gas flow conductance, D is the hole diameter and L is the length of the holes. Generally, for equal sized openings, an opening having a longer length creates a greater pressure loss due to friction than a shorter opening. Likewise, a change in diameter of an opening causes a more dramatic effect on the change in frictional pressure losses than a proportional change in length of the opening since the flow rate of gas is proportional to the diameter of the opening cubed and directly inversely proportional to the length of the opening.

The slope of the top surface 94 of the baffle plate 92 can be designed to achieve desired change in length of openings 100 across the baffle plate 92. In the embodiment shown, the longest opening begins at the high central portion 98 of the baffle plate 92 where the inlet gas pressure is greatest. Due to the sloping surface, the farther an opening is from the high central portion 98 of the baffle plate 92 the shorter its length. With this geometry controlled baffle plate design, it is possible to select the slope of the contoured top surface 94 of the baffle plate 92 and the position of the openings 100 through the baffle plate 92, such that a substantially uniform pressure distribution can be created as gas exits the baffle plate 92 and contacts a backside 28 of the showerhead 22. If a controlled nonuniform pressure distribution is desired, the openings 100 and contour of baffle plate 92 may be selected to create the desired pressure distribution.

The diameter of the openings 100 can be the same across the baffle plate or the diameters can be varied, e.g., large diameter openings 104 can be positioned near the periphery of the baffle plate 92 to provide small frictional pressure losses to relatively low-pressure gas flowing through the openings in the periphery of the baffle plate 92. In a modified geometry controlled baffle plate, the baffle plate can have any desired shape and/or nonuniform hole sizes and/or angle of the holes can be varied to achieve a desired pressure distribution. For instance, if uniform pressure is desired across the showerhead, in a centrally fed gas distribution system the holes can have larger diameters at the periphery of the baffle plate and smaller diameters in the central portion. Conversely, in a gas distribution system wherein the process gas is fed to the periphery of the plenum, the holes can be larger in the middle of the baffle plate.

Figure 3A:
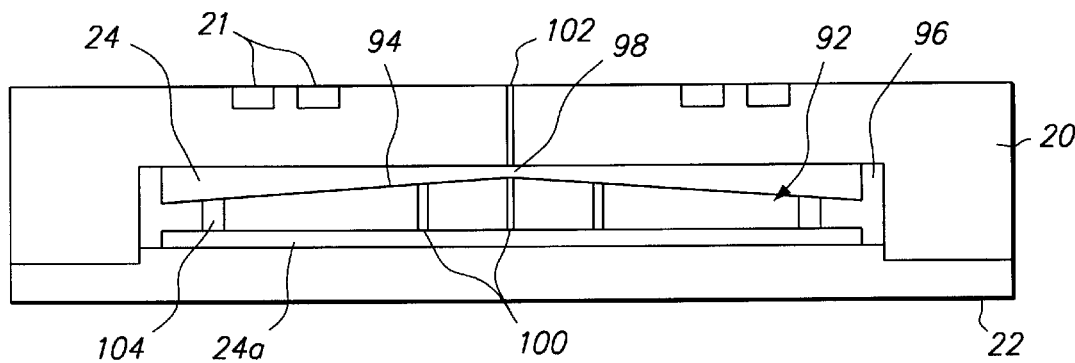
FIGS. 3A–E are sectional views of various contoured surface arrangements in accordance with the invention.

Various embodiments of the contoured surface 94 are shown in FIGS. 3A–E. In FIG. 3A, the contoured surface 94 is an upper surface of a baffle plate 92, the gas inlet 102 supplies process gas to a central portion of the gas distribution chamber 24 and the baffle plate 92 is thicker in the middle and thinner at the outer portion thereof. Thus, in the region where the gas pressure is highest (i.e., where the gas inlet 102 opens into the chamber 24), the openings 100 through the baffle plate are longer and thus serve to lower the gas pressure of the process gas passing therethrough as it enters the lower plenum 24a between the baffle plate 92 and the showerhead 22. As shown in FIG. 3A, the support body 20 can include one or more coolant channels 21.

Figure 3B:
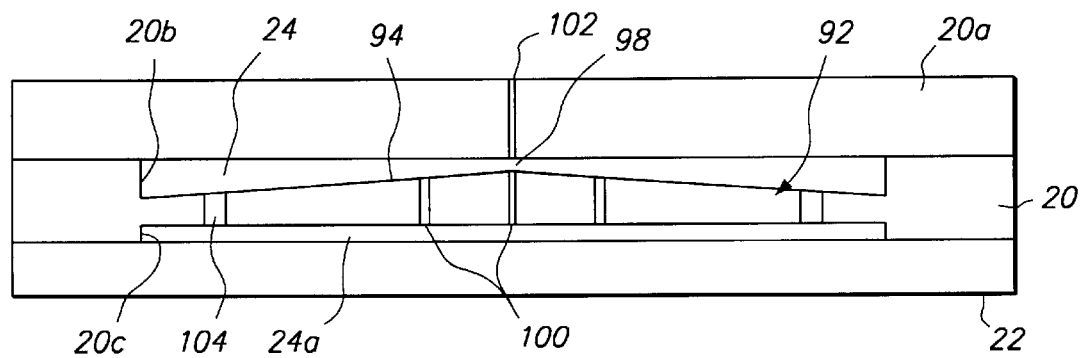

FIG. 3B shows an arrangement wherein the baffle plate 92 is integral with the support body 20. In this case, the contoured surface 94 is an upper surface of the support body 20 and the gas distribution chamber 24 includes an upper plenum between the baffle section 92 and a cover plate 20a and a lower plenum 24a between the baffle section 92 and the showerhead 22. The plenums 24 and 24a are further enclosed by sidewalls 20b, 20c of the support body 20.

Figure 3C:
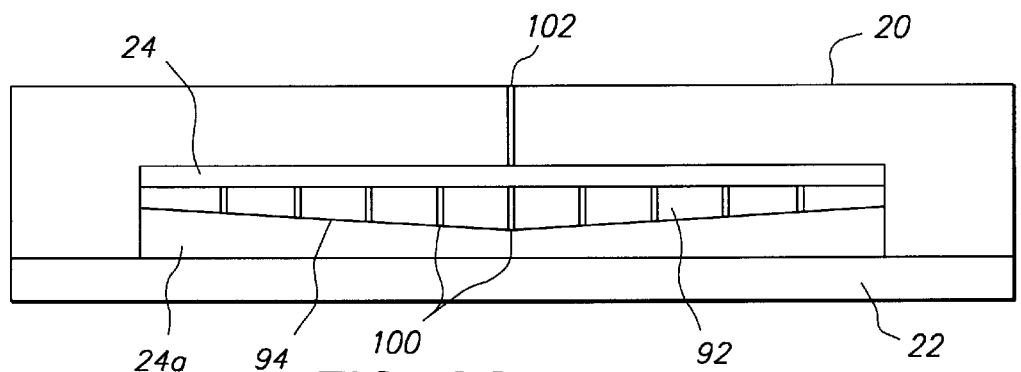

FIG. 3C shows an arrangement wherein the contoured surface 94 is a lower surface of a baffle plate 92. In this arrangement, the gas inlet 102 opens into a central portion of an upper plenum 24 and the baffle plate 92 is thicker in the middle thereof and thinner at the outer portion thereof. As a result, the openings 100 are longer in the central portion of the baffle plate 92 and thus are effective in reducing the gas pressure as the gas passes through the central portion of the baffle plate 92. Thus, like the arrangement wherein the contoured surface 94 is an upper surface of the baffle plate 92, the arrangement shown in FIG. 3C is effective in obtaining a uniform distribution of gas pressure on the backside of the showerhead 22.

Figure 3D:
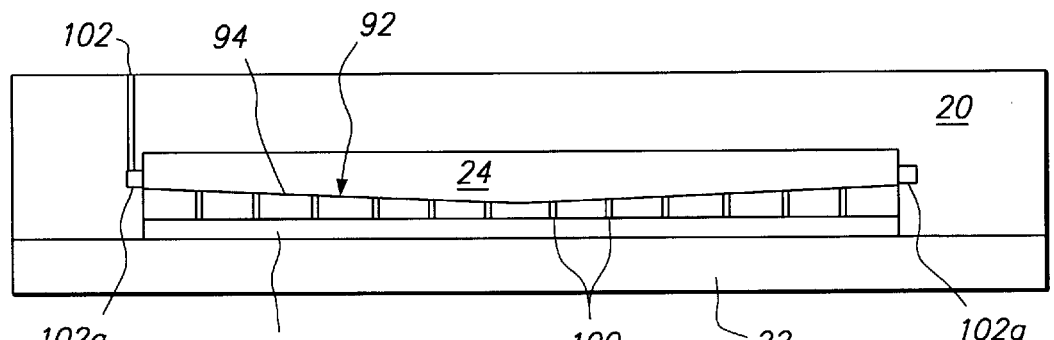

FIG. 3D shows an arrangement wherein the gas inlet 102 opens into an annular channel extending around an upper plenum 24 whereby the process gas enters an outer region of the upper plenum 24. As a result, the gas pressure is highest in the vicinity of the annular channel 102a and the gas pressure becomes lower towards the central region of the plenum 24. The contoured surface 94 is an upper surface of a baffle plate 92, the baffle plate 92 being thicker at an outer portion thereof and thinner in the central portion thereof. Thus, the openings 100 are longer in the outer portion and shorter in the central portion of the baffle plate. As a result, the gas pressure of the process gas passing through the openings in the outer portion of the baffle plate is reduced by the time the process gas enters the lower plenum 24a to provide a more uniform distribution of gas pressure on the backside of the showerhead 22.

Figure 3E:
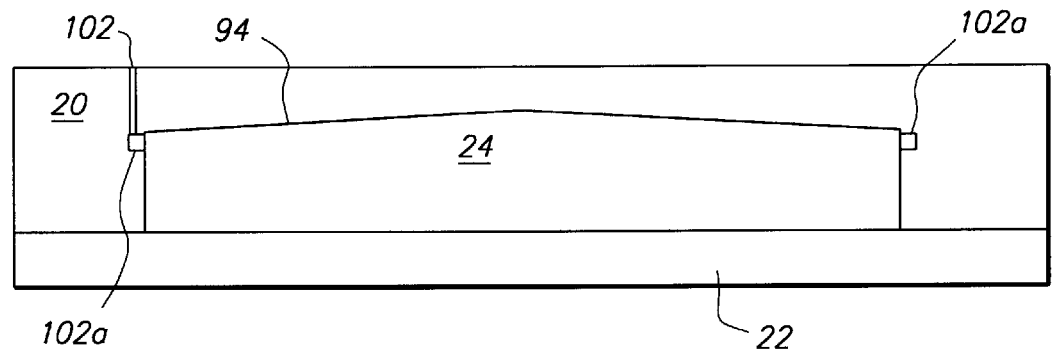

FIG. 3E shows an arrangement wherein the contoured surface 94 is a lower surface of the support body 20. In the arrangement shown, the gas inlet 102 opens into an annular channel at the outer portion of the gas distribution chamber 24. As such, the pressure drop of the gas is reduced in the central region of the chamber 24. Because the contoured surface 94 slopes towards the showerhead 22 and thus decreases the distance between the contoured surface 94 and the backside of the showerhead 22 in a direction towards the outer portion of the showerhead 22, the gas pressure at the backside of the showerhead 22 can be made more uniform. However, if the gas inlet 102 opens into the center of the chamber 24, the contoured surface 94 would be reversed such that the distance between the contoured surface 94 and the backside of the showerhead is greatest at the outer portion of the showerhead and smallest in the central portion of the showerhead.

Figure 4:
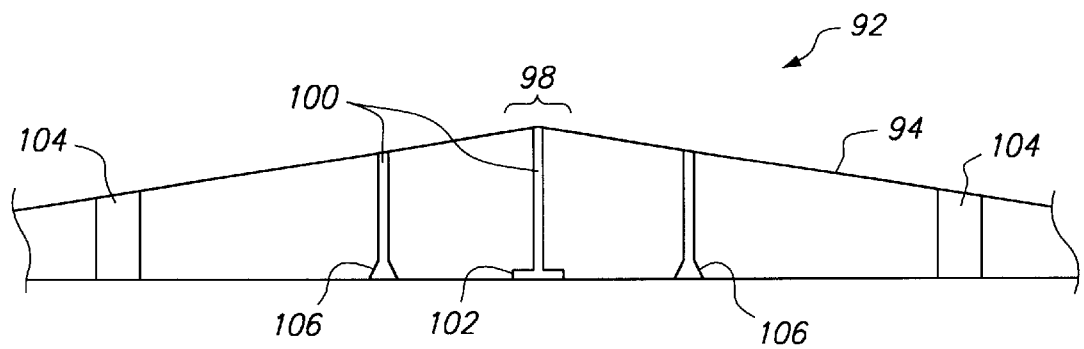
FIG. 4 is a sectional view of a baffle plate according to the third embodiment of the invention.

Each opening through the sloping body has an outlet 106 that opens above the showerhead 22. As shown in FIG. 4, the outlets 106 can be stepped or tapered (e.g., the hole diameter can be largest at the surface 95) at any desired location on the baffle plate so as to act as diffusers to control the pressure of gas exiting the baffle plate 92. The tapered outlets 106 effect a pressure drop in the gas exiting the openings 100 whereas stepped (i.e., abrupt change in diameter) outlets 107 can effect a much greater pressure drop as gas exits the opening. By including a baffle plate having nonuniform thickness and geometry controlled openings, the present invention achieves the desired gas distribution uniformity even when processing large twelve-inch wafers.

Figure 5A:
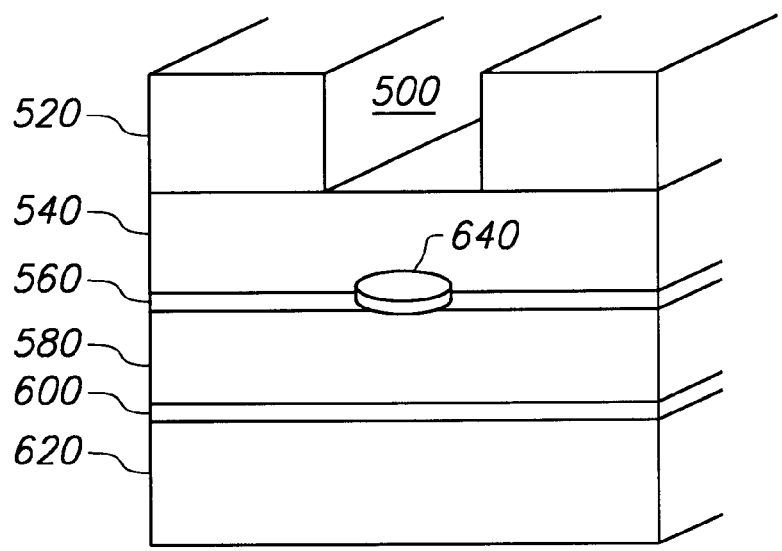
FIGS. 5A–B show an etching process which can be carried out with the gas distribution system of the invention.
Figure 5B:
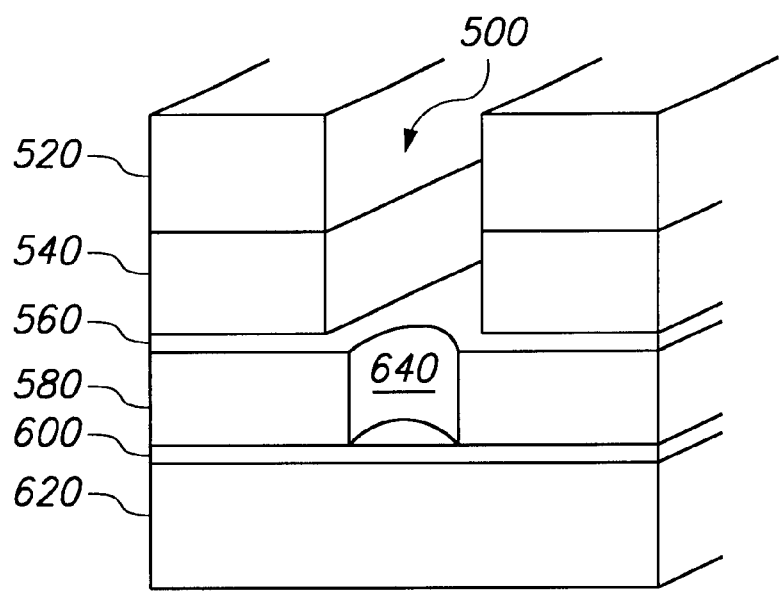

FIGS. 5A–B show schematics of how a dual-damascene structure can be etched in a single step in accordance with the invention. FIG. 5A shows a pre-etch condition wherein an opening 500 corresponding to a trench is provided in a photoresist masking layer 520 which overlies a stack of a first dielectric layer 540 such as silicon oxide, a first stop layer 560 such as silicon nitride, a second dielectric layer 580 such as silicon oxide, a second stop layer 600 such as silicon nitride, and a substrate 620 such as a silicon wafer. In order to obtain etching of vias through the first stop layer 560 in a single etching step, first stop layer 560 includes an opening 640. FIG. 5B shows the structure after etching wherein the opening 500 extends through the dielectric layer 540 to the first stop layer 560 and the opening 640 extends through the second dielectric 580 to the second stop layer 600. Such an arrangement can be referred to as a "self-aligned dual-damascene" structure.

During the etch process, process gas conditions supplied by the first and second gas supplies in the first and second embodiments can be changed relative to each other, e.g., during etching of the trench 500 a mixture of Ar, oxygen and fluorocarbons (e.g., $CHF_3$ and $C_4F_8$) can be supplied and during etching of the vias 640 the flow of the oxygen to the central region of the wafer can be decreased. Thus, according to the invention the flow of gases to the center and edge of the wafer can be adjusted to compensate for edge fast etching and center fast etching conditions in the plasma chamber. For example, in a conventional plasma etcher, edge fast etch conditions can occur until the photoresist is eroded after which center fast etch conditions can occur. With the gas distribution apparatus according to the invention, more oxygen can be supplied in the center when the wafer has a photoresist layer whereas when the photoresist layer is eroded away, the flow of oxygen to the center can be reduced. As a result, more uniform etching can be achieved by compensating for the edge-fast and center-fast etch conditions.

The process of the invention is applicable to various plasma processes including plasma etching of various dielectric layers such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc.

The plasma can be a high density plasma produced in various types of plasma reactors. Such plasma reactors typically have high energy sources which use RF energy, microwave energy, magnetic fields, etc. to produce the high density plasma. For instance, the high density plasma could be produced in a transformer coupled plasma (TCP™) which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A gas distribution system useful for semiconductor substrate processing, comprising:
   a support body;
   a gas distribution chamber;
   a gas supply inlet through which pressurized process gas flows into the gas distribution chamber;
   a showerhead supported by the support body such that pressurized process gas in the gas distribution chamber applies pressure to a backside of the showerhead and passes through openings extending between the backside and an opposite side of the showerhead, the showerhead being a showerhead electrode of a plasma chamber; and
   a contoured surface in the gas distribution chamber, the contoured surface being effective to provide a desired gas pressure distribution at the backside of the showerhead electrode, and wherein the contoured surface comprises a nonplanar upper and/or lower surface of a baffle plate having openings therethrough and the gas distribution chamber comprises an upper plenum above the baffle plate and a lower plenum below the baffle plate.

2. The gas distribution system of claim 1, wherein the baffle plate has uniformly sized openings extending between the upper and lower surfaces, the openings having shorter lengths in a central portion of the baffle plate and longer lengths in an outer portion of the baffle plate.

3. The gas distribution system of claim 1, wherein the baffle plate is integral with the support body, the upper plenum is enclosed by an upper sidewall of the support body and a cover plate which seals against the upper sidewall, and the lower plenum is enclosed by a lower sidewall of the support body and the showerhead which seals against the lower sidewall.

4. The gas distribution system of claim 1, wherein the openings become progressively larger at locations away from the gas supply inlet.

5. The gas distribution system of claim 1, wherein the baffle plate has a conical shape, the openings have the same diameters and the openings have different lengths through the baffle plate.

6. The gas distribution system of claim 1, wherein at least some of the outlets are tapered.

7. A gas distribution system useful for semiconductor substrate processing, comprising:

a support body;

a gas distribution chamber;

a gas supply inlet through which pressurized process gas flows into the gas distribution chamber, a showerhead supported by the support body such that pressurized process gas in the gas distribution chamber applies pressure to a backside of the showerhead and passes through openings extending between the backside and an opposite side of the showerhead, the showerhead being a showerhead electrode of a plasma chamber; and a contoured surface in the gas distribution chamber, the contoured surface being effective to provide a desired gas pressure distribution at the backside of the showerhead electrode wherein the contoured surface is a nonplanar lower surface of the support body and the gas distribution chamber comprises an open space between the contoured surface and the backside of the showerhead wherein the showerhead is spaced closer to the contoured surface in the vicinity of the gas supply inlet and further from the contoured surface at locations away from the gas supply inlet.

8. The gas distribution system of claim 7, wherein the gas inlet supplies process gas through an annular channel which opens into an outer region of the open space and the showerhead is spaced closer to the contoured surface in the outer region and further from the contoured surface in a central region of the open space.

9. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a nonplanar upper and/or lower surface of a baffle plate having openings therethrough and the gas distribution chamber comprising an upper plenum above the baffle plate and a lower plenum below the baffle plate, the gas inlet supplying the process gas through a central opening in a planar surface facing the baffle plate, the baffle plate having a thickness which is larger in a central portion of the baffle plate and smaller at an outer portion of the baffle plate.

10. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a nonplanar upper and/or lower surface of a baffle plate having openings therethrough and the gas distribution chamber comprising an upper plenum above the baffle plate and a lower plenum below the baffle plate, the gas inlet supplying the process gas through an inlet which opens into an outer region of the upper plenum, the baffle plate having a thickness which is smaller in a central portion of the baffle plate and larger at an outer portion of the baffle plate.

11. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a nonplanar upper and/or lower surface of a baffle plate having openings therethrough and the gas distribution chamber comprising an upper plenum above the baffle plate and a lower plenum below the baffle plate, the baffle plate having uniformly sized openings extending between the upper and lower surfaces, the openings having longer lengths in a central portion of the baffle plate and shorter lengths in an outer portion of the baffle plate.

12. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface being a nonplanar lower surface of the support body and the gas distribution chamber comprising an open space between the contoured surface and the backside of the showerhead, the gas inlet supplying the process gas through a central opening in the lower surface of the support body and the open space being smaller in a central region thereof and larger in an outer region thereof.

13. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a non-planar upper and/or lower surface of a baffle plate having openings therethrough and the gas distribution chamber comprising an upper plenum above the baffle plate and a lower plenum below the baffle plate, the support body including at least one coolant channel in which coolant can be circulated.

14. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between backside and an opposite side of the showerhead; and a contoured surface in the gas distribution chamber, the contoured surface being effective to provide a desired gas pressure distribution at the backside of the showerhead, the contoured surface comprising a non-planar upper and/or lower surface of a baffle plate having openings therethrough and the gas distribution chamber comprising an upper plenum above the baffle plate and a lower plenum below the baffle plate, the support body including a second gas supply inlet which supplies process gas that passes through the baffle plate.

15. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a non-planar upper and/or lower surface of a baffle plate having openings therethrough and the gas distribution chamber comprising an upper plenum above the baffle plate and a lower plenum below the baffle plate, the openings having the same diameters and the openings having progressively shorter lengths at locations away from the gas supply inlet.

16. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a non-planar upper and/or lower surface of a baffle plate having openings therethrough and the gas distribution chamber comprising an upper plenum above the baffle plate and a lower plenum below the baffle plate, the openings at a peripheral portion of the baffle plate having larger diameters than the openings proximate a central region of the baffle plate.

17. A gas distribution system useful for semiconductor substrate processing, comprising:

a support body;

a gas distribution chamber;

a gas supply inlet through which pressurized process gas flows into the gas distribution chamber;

a showerhead supported by the support body such that pressurized process gas in the gas distribution chamber applies pressure to a backside of the showerhead and passes through openings extending between the backside and an opposite side of the showerhead; and a contoured surface in the gas distribution chamber, the contoured surface being effective to provide a desired gas pressure distribution at the backside of the showerhead, the contoured surface comprising a non-planar upper and/or lower surface of a baffle plate having openings therethrough and the gas distribution chamber comprising an upper plenum above the baffle plate and a lower plenum below the baffle plate, at least some of the openings having diameters which change along the length of the openings.

\* \* \* \* \*